(12) United States Patent
Rausch et al.

(10) Patent No.: US 7,612,620 B2
(45) Date of Patent: Nov. 3, 2009

(54) SYSTEM AND METHOD FOR CONDITIONING DIFFERENTIAL CLOCK SIGNALS AND INTEGRATED CIRCUIT LOAD BOARD USING SAME

(75) Inventors: Greg Rausch, Plymouth, MN (US);
Robert Rabe, Chanhassen, MN (US);
Curtis Schnarr, Shoreview, MN (US)

(73) Assignee: Micron Technology, Inc., Boise, ID (US)

( * ) Notice: Subject to any disclaimer, the term of this patent is extended or adjusted under 35 U.S.C. 154(b) by 181 days.

(21) Appl. No.: 11/824,075

(22) Filed: Jun. 29, 2007

(65) Prior Publication Data
US 2009/0002042 A1    Jan. 1, 2009

(51) Int. Cl.
*H03B 27/00* (2006.01)
*H03K 3/017* (2006.01)
*H03K 5/04* (2006.01)

(52) U.S. Cl. .......................... 331/45; 327/144; 327/175
(58) Field of Classification Search .................. 331/45; 327/144, 146, 153, 161, 163, 175; 375/376
See application file for complete search history.

(56) References Cited

U.S. PATENT DOCUMENTS

| 4,837,781 | A * | 6/1989 | Hickling | 375/327 |
| 2007/0090866 | A1 * | 4/2007 | Park et al. | 327/175 |

\* cited by examiner

*Primary Examiner*—Daniel D Chang
(74) *Attorney, Agent, or Firm*—Dorsey & Whitney LLP

(57) ABSTRACT

A system and method of conditioning differential clock signals iteratively adjusts the duty cycles and phases of the clock signals. The duty cycles of the clock signals are adjusted by comparing respective voltage corresponding to the duty cycles of respective clock signals in each of the differential pairs. The result of the comparison is used to adjust the duty cycles of the clock signal until the magnitudes of the voltages are substantially equal. The phases of the clock signals are adjusted by selecting two sets of two clock signals each that are assigned relative phases that differ from each other by the same amount. The selected sets of clock signals are processed so that the duty cycles of resulting signals correspond to the phases of the clock signals. The duty cycle of these signals is measured as described above and used to adjust the phases of the clock signals.

39 Claims, 6 Drawing Sheets

US 7,612,620 B2

SYSTEM AND METHOD FOR CONDITIONING DIFFERENTIAL CLOCK SIGNALS AND INTEGRATED CIRCUIT LOAD BOARD USING SAME

TECHNICAL FIELD

This invention relates to testing integrated circuits and, more particularly, to a system and method for conditioning clock signals used in the testing of integrated circuits to correct for duty cycle errors in the clock signals.

BACKGROUND OF THE INVENTION

During the fabrication of integrated circuits such as memory devices, it is conventional to test such integrated circuits at several stages during the fabrication process. For example, the integrated circuits are normally connected to a tester with a probe card when the integrated circuits are still in wafer form. In a final test occurring after the integrated circuits have been diced from the wafer and packaged, the integrated circuits are placed into sockets on a load board. The load board is then placed on a test head, typically by a robotic handler. The test head makes electrical contact with conductors on the load board that are connected to the integrated circuits. The test head is connected through a cable to a high-speed tester so that the tester can apply signals to and receive signals from the integrated circuits.

While the above-described testing environment works well in many applications, it is not without its limitations and disadvantages. For example, it is very difficult to test various timing characteristics of the integrated circuits, particularly at the high operating speeds for which such integrated circuits are designed. This difficulty in testing timing characteristics results primarily from the propagation delays in the cable coupling the tester to the test head. The cables that are typically used in such testing environments are often fairly long, thus making the delays of signals coupled to and from the integrated circuits correspondingly long and often difficult to predict.

Another problem with the above-described testing environment is that it may not accurately simulate the conditions in which the integrated circuits will be actually used. In actual use, integrated circuits, such as dynamic random access memory ("DRAM") devices are typically mounted on a printed circuit board. Signals are applied to the integrated circuits by other integrated circuits mounted on the board, and signals generated by the integrated circuits are received by other integrated circuits mounted on the board. In most applications, signals are not coupled to and from the integrated circuits through long cables coupled to distant electronic devices. Therefore, the testing environment is normally quite different from the environment in which the integrated circuits will operate in normal use.

While techniques have been developed to deal with these difficulties, the use of these techniques results in testers that are highly complex and often very expensive. A large number of testers are normally required for a high capacity semiconductor fabrication plant, thus greatly increasing the cost of the plant and the expense of testing the integrated circuits.

One improved testing system that has been proposed is to fabricate an integrated test circuit that performs most if not all of the functions of conventional testers, and mount the integrated test circuit on the test head or load board to which the integrated circuits being tested are coupled. By placing the testing function on the test head or load board itself, the problems inherent in coupling test signals between a testing system and a test head are eliminated. As a result, the circuits can be tested in a more realistic environment. Furthermore, since even custom integrated circuits can be fabricated relatively inexpensively, the cost of testing systems can be greatly reduced.

One difficulty in using an integrated test circuit in this manner stems from the difficulty in generating and/or maintaining high fidelity signals sent to the integrated circuits such as DRAM devices in order to test the devices. Traditionally, the output of a clock source would go directly into a phase interpolator or a group of phase interpolators and then use JTAG to communicate with the integrated circuits. When errors in duty cycle and/or phase placement occur at the inputs of the phase interpolators, the accuracy of clock signals generated by interpolation is affected causing inaccuracies in the testing of the integrated circuits. Additionally, phase interpolation is more linear if the interpolation is performed between phases that do not differ greatly from each other. Therefore, the ability of phase interpolators to provide clock signals having highly accurate phases is facilitated by providing to the phase interpolators a relatively large number of clock signals having phases that are fairly close to each other, e.g., within 45 degrees of each other.

There is therefore a need for a testing system and method that can provide clock signals with highly accurate duty cycles and phases to thereby improve the linearity of phase interpolation.

DETAILED DESCRIPTION

Figure 1:
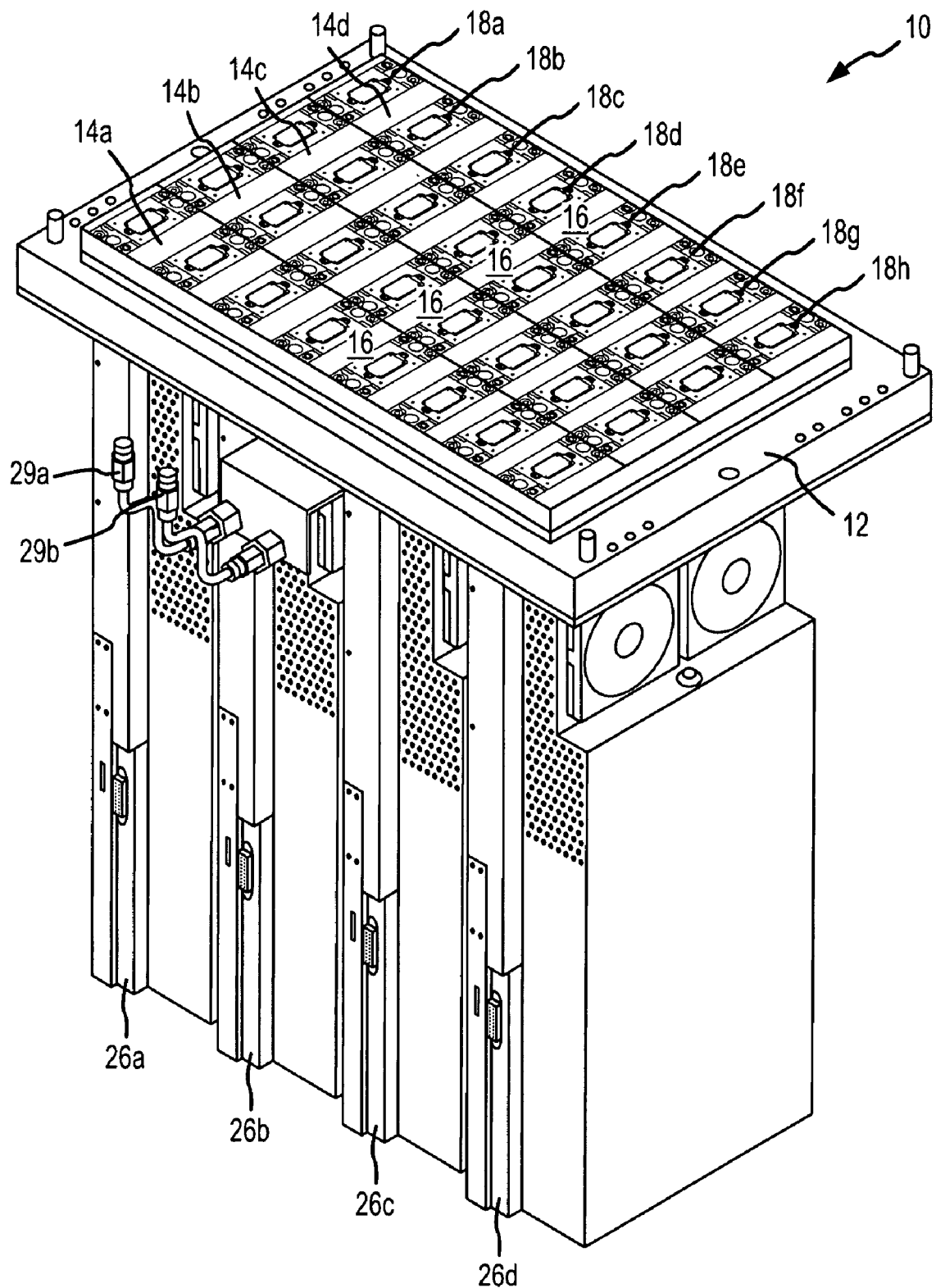
FIG. 1 is an isometric view of a test system according to one example of the invention.

A test system 10 according to one example of the invention is illustrated in FIG. 1. The test system 10 includes a test head 12 on which several load boards 14a-d are placed. Each of the load boards 14a-d have a printed circuit substrate 16 on which several integrated circuit sockets 18a-h are mounted. Each of the integrated circuit sockets 18a-h receives a respective integrated circuit (not shown in FIG. 1). In the example shown in FIG. 1, the sockets 18a-h are adapted to receive integrated circuit memory devices, such as dynamic random access memory ("DRAM") devices. Prior to final testing of the integrated circuits, an integrated circuit handler (not shown) loads an integrated circuit into each of the sockets 18a-h, and then places each of the load boards 14a-d on the test head 12.

Figure 2A:
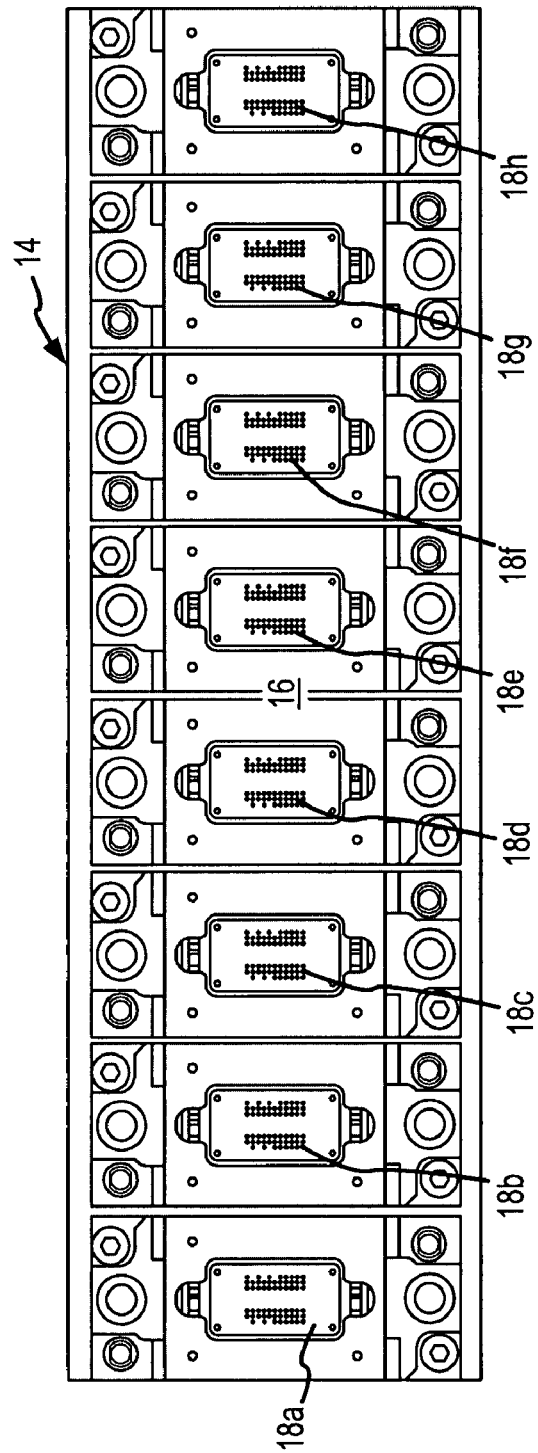
FIGS. 2A and 2B are top and bottom plan views, respectively, of a load board used in the test system of FIG. 1.
Figure 2B:
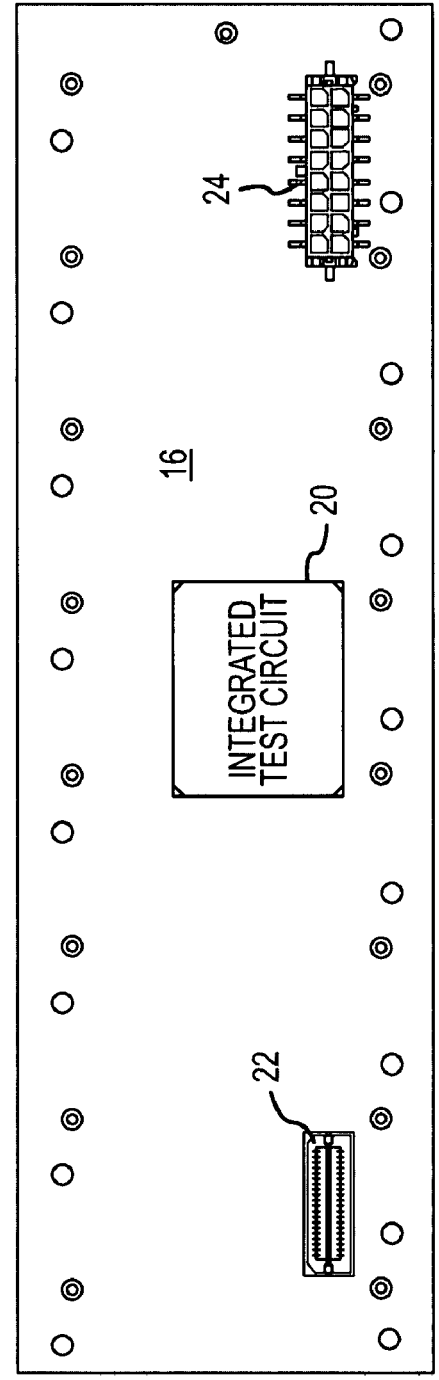

As explained in greater detail below, each of the load boards 14a-d includes an integrated test circuit (not shown in FIG. 1) mounted on the surface of the substrate 16 opposite the service on which the sockets 18a-h are mounted. The sockets 18a-h are shown mounted on the upper surface of the substrate 16 in greater detail in FIG. 2A. The lower surface of the substrate 16 is shown in FIG. 2B. The integrated test circuit 20 is mounted at the center on the lower surface of the substrate 16, and it is connected to the sockets 18a-h through conventional printed circuit traces (not shown in FIG. 2B). Also mounted on the lower surface of the substrate 16 are a conventional JTAG connector 22 and a power supply connector 24. As explained in greater detail below, a test file containing test instructions, such as the characteristics of memory commands used by memory devices in the sockets 18*a-h* or the address range to be tested, are applied to the integrated test circuit 20 through the JTAG connector 22. The test file is stored in random access memory ("RAM") internal to the integrated test circuit 20. Results data are subsequently received from the integrated test circuit 20 through the JTAG connector 22. Power is applied to the integrated test circuit 20 as well as to integrated circuits mounted in the sockets 18*a-h* through the power supply connector 24. The integrated test circuit 20 includes a command generator (not shown) that generates memory command signals, and an address generator (not shown) that generates memory address signals. The integrated test circuit 20 also contains a write data generator (not shown) including a pattern generator that generates a pattern of write data signals.

In operation, the integrated test circuit 20 writes a pattern of signals to the integrated circuits mounted in the sockets 18*a-h* by coupling appropriate command and address signals, as well as the pattern of write data, to the integrated circuits mounted in the sockets 18*a-h*. In response to coupling appropriate command and address signals generated by the integrated test circuit 20, the integrated test circuit 20 receives read data from the integrated circuits. The integrated test circuit 20 compares the read data to the write data to determine if the integrated circuits in the sockets 18*a-h* are functioning properly. Insofar as the integrated test circuit 20 is mounted on the same substrate 16 as the integrated circuits, the timing at which the signals in the pattern are applied to the integrated circuits can be more precisely controlled. Furthermore, the relatively short length of the conductors extending from the integrated test circuit 20 to the integrated circuits in the sockets 18*a-h* allows the circuitry in the integrated test circuit 20 to be less complex and therefore less expensive than with testers in which a pattern of test signals is applied through a long cable.

With further reference to FIG. 1, the test head 12 is mounted on the upper ends of several power supplies 26*a-d*, which generate DC supply voltages at respective magnitudes for use by the test head 12 and the load boards 14*a-d*. As mentioned above, the DC supply voltages are applied to the test head 12 through the power supply connector 24 (FIG. 2B). The test head 12 also includes fluid couplings 29*a,b* that receive and discharge a cooling fluid, respectively, for maintaining the temperature of the integrated test circuit 20 at a constant acceptably cool temperature.

Figure 3:
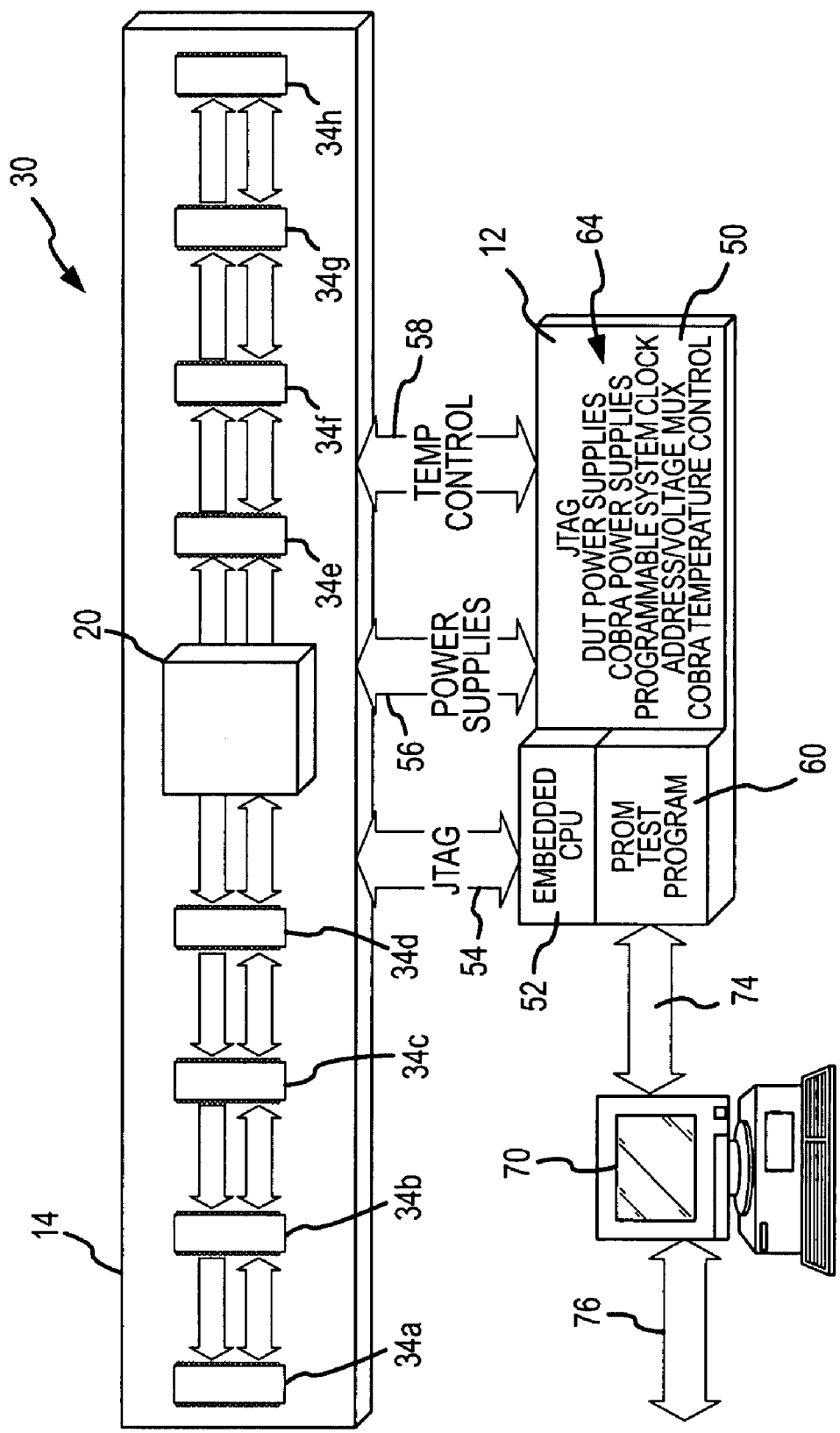
FIG. 3 is a block diagram of the test system of FIG. 1.

The basic components of a test system 30 that includes the test head 12 and load boards 14*a-d*, as well as a host, is shown in FIG. 3. In the example shown in FIG. 3, eight integrated circuits 34*a-h* are mounted on each of the load boards 14*a-d* (only one load board 14 is shown in FIG. 3). In one embodiment, the integrated circuits 34*a-h* are memory devices. The integrated circuits 34*a-h* are coupled to the integrated test circuit 20 through a common uni-directional address/control bus and a common bi-directional data bus.

The test head 12 includes interface circuitry 50, including an embedded CPU 52. The interface circuitry 50 is coupled to the load board 14 through a conventional JTAG bus 54 and the JTAG connector 22 (FIG. 2B). The interface circuitry 50 supplies power to the load board 14 through power supply lines 56 and the power supply connector 24 (FIG. 2B). Finally, the interface circuitry 50 includes temperature control lines 58 that provide signals indicative of the temperature of the load board 14. The interface circuitry 50 includes a test program, which may be stored in a programmable read only memory ("PROM") 60 included in the interface circuitry 50. This test program performs tests on a programmable system clock, address/voltage multiplexers, and temperature control circuits 64 which are included in the interface circuitry along with the CPU 52.

In operation, the interface circuitry 50 receives a test file from a host 70, which may be a conventional personal computer. The host 70 is coupled to the interface circuitry 50 through suitable means, such as a Local Ethernet network 74. The host 70 may also be coupled to a larger network, such as a production management system, through a Corporate Ethernet network 76. The interface circuitry 50 then passes the test file onto the integrated test circuit 20, which then applies a pattern of write data signals to the integrated circuits 34*a-h* with precisely controlled timing. The integrated test circuit 20 then receives read data signals from the integrated circuits 34*a-h* and outputs test result data to the CPU 52. The CPU 52 outputs the test data to the host 70. In the event the integrated circuits 34*a-h* are devices other than memory devices, the integrated test circuit 20 generates signals other than memory command, address and data signals to write a pattern of data to the memory devices with precisely controlled timing. After the pattern of data has been written to the memory devices, the integrated test circuit 20 generates command and address signals to read the contents of the memory devices, and it compares the read data with the write data to determine if the memory devices properly stored the write data. The integrated test circuit 20 formulates the test results into high-level test data, which it passes to the test head 12 through the JTAG bus 54. The test head 12, in turn, collects the test data and sends it to the host 70 through the Local Ethernet network 74.

Figure 4:
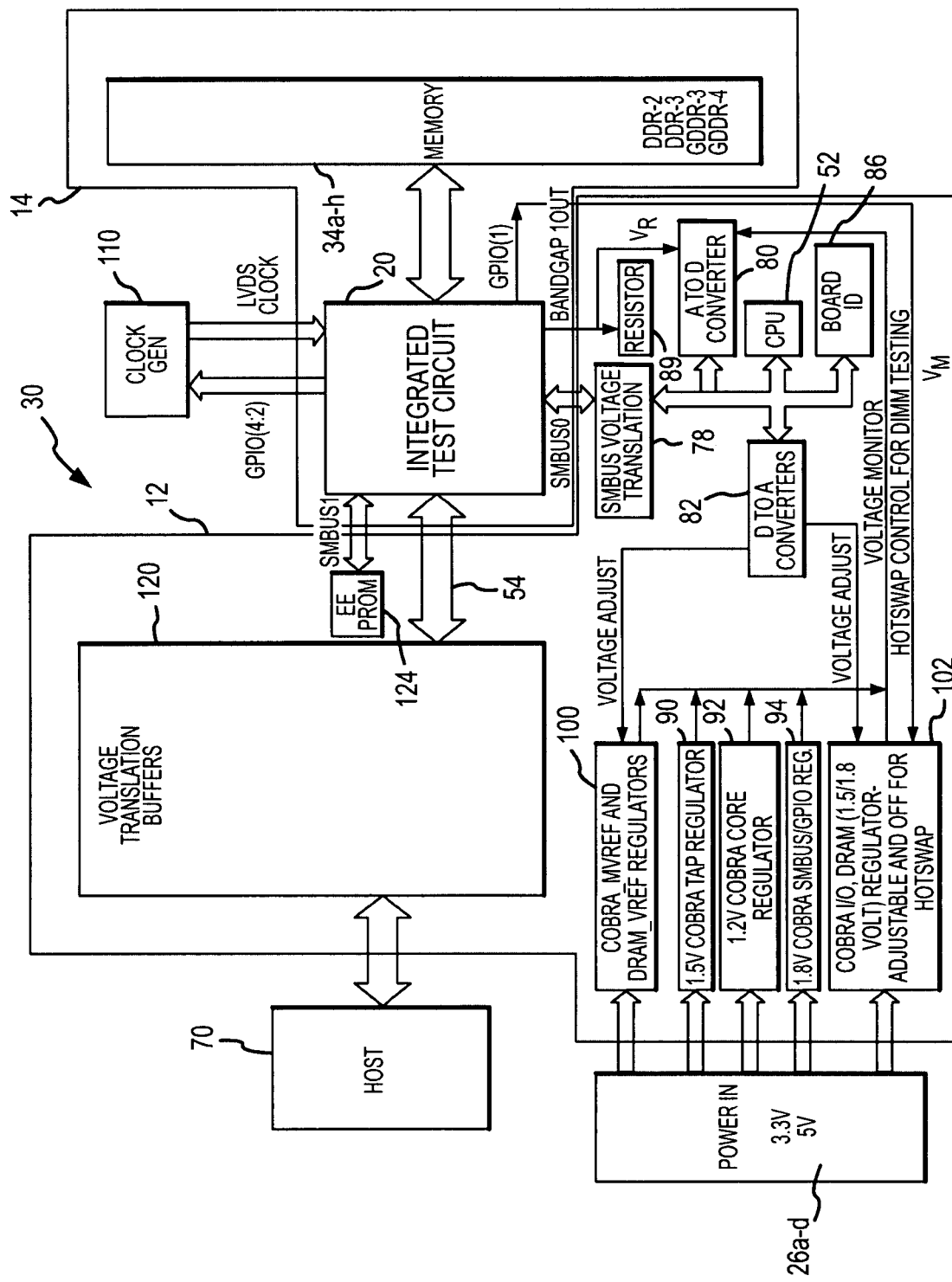
FIG. 4 is a more detailed block diagram of a test head used in the test system of FIG. 1.

The circuitry in the load board 14 and the test head 12 are shown in greater detail in FIG. 4. FIG. 4 shows the integrated test circuit 20 coupled to the integrated circuits 34*a-h*. The integrated test circuit 20 has a system management bus ("SMBus") that is coupled to several components in the test head 12. More specifically, the SMBus is coupled through a voltage translation buffer 78 to an analog-to-digital converter 80, a digital-to-analog converter 82, a board identifier 86, which outputs data indicative of the identity of the load board 14, and a CPU 52. The integrated test circuit 20 includes a Bandgap reference generator (not shown) that outputs a precisely controlled current. This current is converted to a reference voltage $V_R$ by passing the reference current through a resistor 89 in the test head 12. The reference voltage $V_R$ is applied to the analog-to-digital converter 80, which also receives a monitored voltage $V_M$. The analog-to-digital converter 80 outputs a digital value indicative of either the reference voltage $V_R$ or the monitored voltage $V_M$, and this digital value is coupled to the CPU 52 through the SMBus.

The test head 12 receives supply voltages from the power supplies 26*a-d* (FIG. 1), and includes voltage regulators 90, 92, 94 that regulate the power supply voltages to fixed magnitudes of 1.5V, 1.2V and 1.8V. The test head 12 also includes adjustable voltage regulators 100, 102 that generate variable voltages. The magnitudes of the variable voltages are controlled by the magnitudes of voltage adjust signals generated by the digital-to-analog converter 82 responsive to digital signals received from the CPU chip 52 through the SMBus.

The integrated test circuit 20 also receives clock signals from a clock generator 110 having a frequency that is determined by a digital signal from the integrated test circuit 20. The frequency of the clock signals controls the rate at which command, address and write data signals are transferred to the memory devices 34*a-h* and read data are transferred from the memory devices 34a-h. The integrated test circuit 20 also uses the clock signals from the clock generator 110 to control the relative timing at which the command, address and write data signals are transferred to the memory devices 34a-h. The integrated test circuit 20 is therefore able to test the memory devices 34a-h over a wide range of operating speeds and timing relationships. The clock generator 110 includes a system for conditioning the clock signals. More specifically, the clock signal conditioning system used in the clock generator 110 corrects the duty cycle of the clock signals. This allows timing adjustment circuits (not shown) in the integrated test circuit 20 to more accurately adjust the relative timing between the command, address and write data signals applied to the memory devices 34a-h. The clock signal conditioning system used in the clock generator 110 may be the system shown in FIG. 5 and explained below, or it may be a clock signal conditioning system according to other examples of the invention.

As explained above, the integrated test circuit 20 outputs test results through the JTAG bus 54. The JTAG bus 54 is coupled to voltage translation buffers 120, which convert the signals from logic levels used by the integrated test circuit 20 to logic levels used by the host 70, which, as explained above with reference to FIG. 3, is coupled to the test head 12.

Finally, the integrated test circuit 20 is coupled to an electrically eraseable programmable read-only memory ("PROM") 124, which contains calibration data that precisely characterizes the timing characteristics of the integrated test circuit 20. As a result, differences in the timing characteristics of the signals generated by the integrated test circuit 20 can be compensated for so that the timing characteristics of the signals applied to integrated circuits being tested can be precisely controlled.

In operation, the CPU 52 applies test commands to the integrated test circuit 20, as explained above. These test commands might be, for example, simply a command to write specific data values to a specific address in the integrated circuits 34a-h. The integrated test circuit 20 responds to the test commands by generating command, address and write data signals that are coupled to the integrated circuits 34a-h at various times relative to each other. These signals cause the write data to be written to the integrated circuits 34a-h. At the same time, the analog-to-digital converter 80 monitors the reference voltage from the resistor 89 and the adjustable voltage regulators 100, 102. After comparing the monitored voltages $V_M$ from the regulators 100, 102 to the reference voltage $V_R$, the CPU 52 adjusts the variable voltages to the desired values by outputting corresponding voltage control data to the digital-to-analog converter 82. As a result, the integrated test circuit can test the integrated circuits 34a-h with different supply voltage values, at different operating speeds and, as explained below, with different timings of the command, address and data signals.

Figure 5:
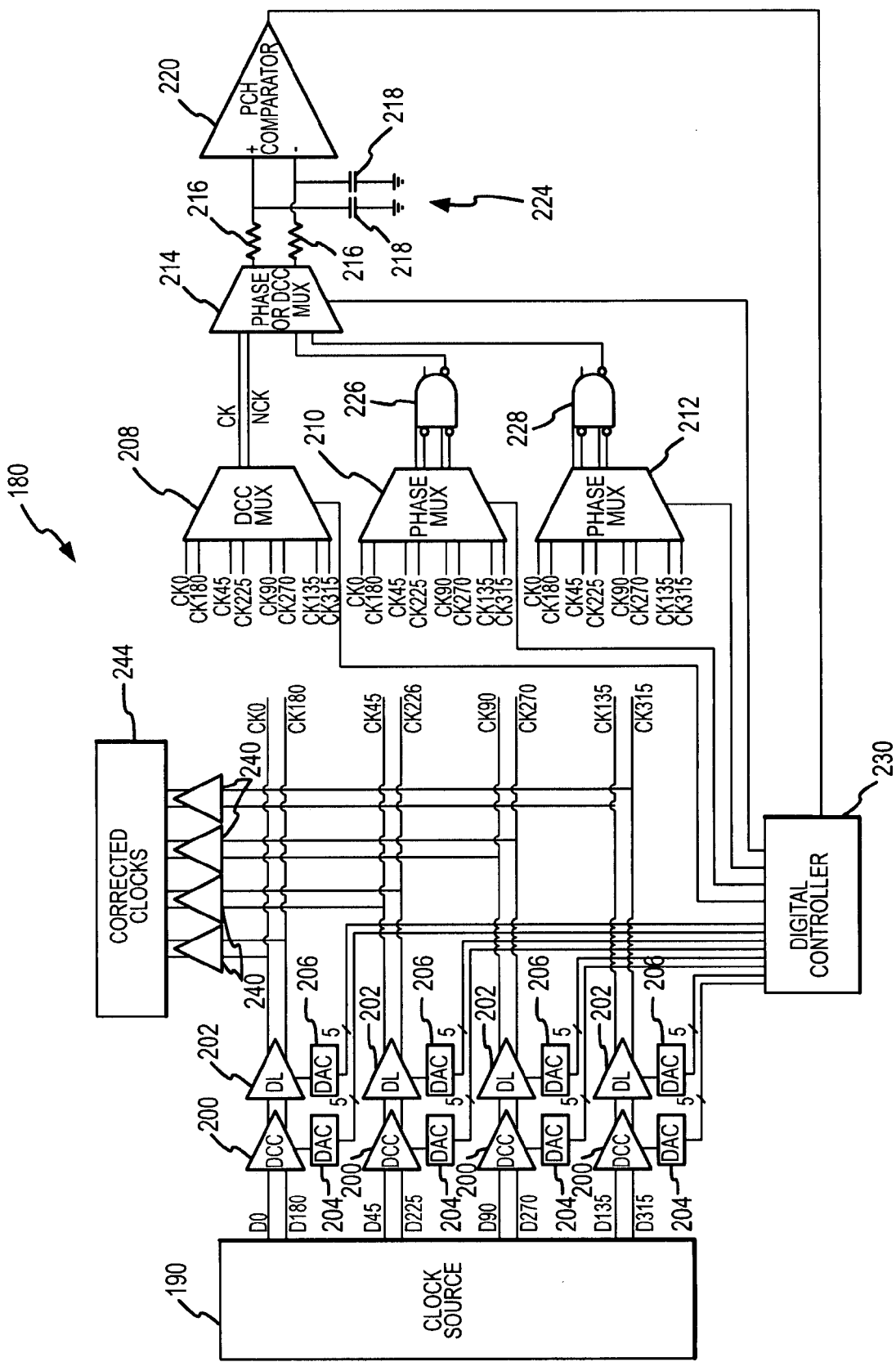
FIG. 5 illustrates one embodiment of a duty cycle and phase placement correction circuit for a clock generator.

FIG. 5 illustrates one embodiment of a clock signal conditioning circuit 180 for the clock generator 110. The timing of signals coupled from the integrated test circuit 20 (FIG. 4) to the memory device 34 is derived from internal clock signals generated by a phase locked loop ("PLL") or a delay locked loop ("DLL"). As is well-known in the art, the PLL includes a voltage controlled oscillator having a phase that is locked to the phase of a reference clock signal. The reference clock signal is, in this case, the clock signal from the clock generator 110 (FIG. 4) labeled here as clock source 110. The PLL includes a conventional phase interpolator so that the clock signals generated by the PLL can have a variety of phases relative to the phase of the reference clock signal. By using a variety of phases of the internal clock signal from the PLL, the integrated test circuit 20 is able to vary the timing of command, address and write data signals applied to the memory devices 34a-h to test the memory device 34a-h.

For illustrative purposes only, eight phases 0°, 45°, 90°, 135°, 180°, 225°, 270° and 315° are used. However, the system and method is adapted to use fewer phases or more phases than eight. The method can be performed with or without automation and for simplicity purposes, the method will be described as starting first with the duty cycle correction and then phase placement correction, though phase placement correction can be done before the duty cycle correction process.

When performing duty cycle correction, differential phase pairs, for example 0° with 180°, 45° with 225°, 90° with 270° and 135° with 315° are sent from a clock source 190 within the clock generator 110 (FIG. 4) to respective duty cycle correctors 200 of conventional design. Each of the duty cycle correctors 200 is controlled by a signal from a respective digital-to-analog converter ("DAC") 204. On a first pass, the DACs 204 are set for a low duty cycle, and the differential phase pairs from the duty cycle correctors 200 are coupled through differential delay lines 202 to input pairs of a duty cycle corrector multiplexer ("DCC MUX") 208. Each of the differential delay lines 202 is controlled by a signal from a respective digital-to-analog converter ("DAC") 206. The clock signals in the differential phase pair selected by the multiplexer 208 are applied to a secondary multiplexer 214, which couples the clock signals to a low-pass filter 224 composed of respective resistor 216 and capacitor 218 pairs.

The filter 224 generates voltages that correspond to the duty cycle of each phase in the pair. For example, if the 45° and 225° pair is selected, one of the voltages generated by the filter 224 will have a magnitude corresponding to the percentage of time that the 45° clock signal is high compared to the time that the 45° clock signal is low. The other voltages generated by the filter 224 will have a magnitude corresponding to the percentage of time that the 225° clock signal is high compared to the time that the 45° clock signal is low. Insofar as the 45° clock signal and the 225° clock signal are complements of each other, if the 45° clock signal has a duty cycle greater than 50%, the 225° clock signal will have a duty cycle less than 50%. The voltage generated by the filter 224 from the 45° clock signal will therefore be greater than the voltage generated by the filter 224 from the 225° clock signal. The differential voltage generated by the filter 225 is received by a comparator 220 that outputs a digital signal, such as a "1" or a "0," indicative of the polarity of the differential voltage comparison.

For duty cycle correction, the digital signal output by the comparator 220 is sent to a digital controller 230. The digital controller 230 generates digital control signals based on the digital signal from the comparator 220 that are applied to the DACs 204. The DACs 204 generate corresponding analog signals that cause the duty cycle correctors 200 to increase or decrease the duty cycle based on the voltage measured. In one embodiment, the comparator 220 includes a programmable offset control (not shown) in order to subtract out any internal offset in either the comparator 220 itself or the path to the comparator 220. In one embodiment, both the inputs of the comparator 220 receive the same phase in order to calibrate the comparator 220. In one embodiment, the comparator 220 is clocked with a slow speed clock, for example 1/32 of the data rate, which introduces data consistency concerns. The filter 224 generally cannot eliminate all of the ripple, so different frequencies of operation will sample different points in the ripple. To resolve this problem, the slow clock is re-sampled using the incoming clock source 110 that is being measured and the re-sampled slow clock is used as the clock input to the comparator 220. Either the rising or falling edge can be used for the re-sampling, allowing for calibration and more consistency in where the voltage is sampled. In one embodiment, the comparator 220 is an n-channel input type and generally samples voltages at the lower end of 600 mV to 1.2V input range, though higher voltages can be sampled as well.

In operation, the duty cycle of the 45° clock signal will initially be set to a low duty cycle, as mentioned above. Therefore, the initial digital output of the comparator 220 will initially be a "0," signaling that the duty cycle of 45° clock signal is too low and the duty cycle of the 225° clock signal is too high. As long as the output of the comparator 220 remains "0," the digital controller 230 will apply signals to the DAC 204 for the 45° and 225° clock signals that increase the duty cycle of the 45° clock signal and reduce the duty cycle of the 225° clock signal. When the output of the comparator 220 transitions from "0" to "1," the duty cycles of the 45° and 225° clock signals are considered to be at 50%, and the signal that the digital controller 230 is then applying to the DAC 204 for the 45° and 225° clock signals is saved for use during testing. The amount of times that the comparator 220 is toggled between a "1" and a "0" can be either once or many times for additional accuracy. The multiplexer 208 then selects the 90° and 270° clock signals for coupling to the filter 224, and the above procedure is repeated. This duty cycle correction process is repeated for each differential phase pair at the outputs of the respective delay lines 202.

When the above duty cycle correction process is completed, a phase placement correction process starts. However, as stated above, the phase placement correction process can instead precede the duty cycle correction process. On a first pass of the phase placement correction, the digital controller 230 sets the delay provided by the delay line 202 for one of the phase pairs to a small delay. The clock signals from the delay line are coupled by phase multiplexers 210, 212 to respective NAND gates 226, 228. For illustrative purposes only, NAND gates 226, 228 are shown, though any logic gates can be used. The NAND gates 226, 228 apply respective output signals to the filter 224 through the multiplexer 214. The comparator 220 then outputs a digital signal indicative of the polarity of the comparison. The filter 224 and comparator 220 function in the same manner as explained above for duty cycle correction so that the value of the digital signal is indicative of a comparison of the duty cycle of the signals applied to the filter 224. As a result, the digital signals generated by the comparator 220 is indicative of a comparison of the duty cycle of the signal at the output of the NAND gate 226 and the duty cycle of the signal at the output of the NAND gate 228.

Figure 6:
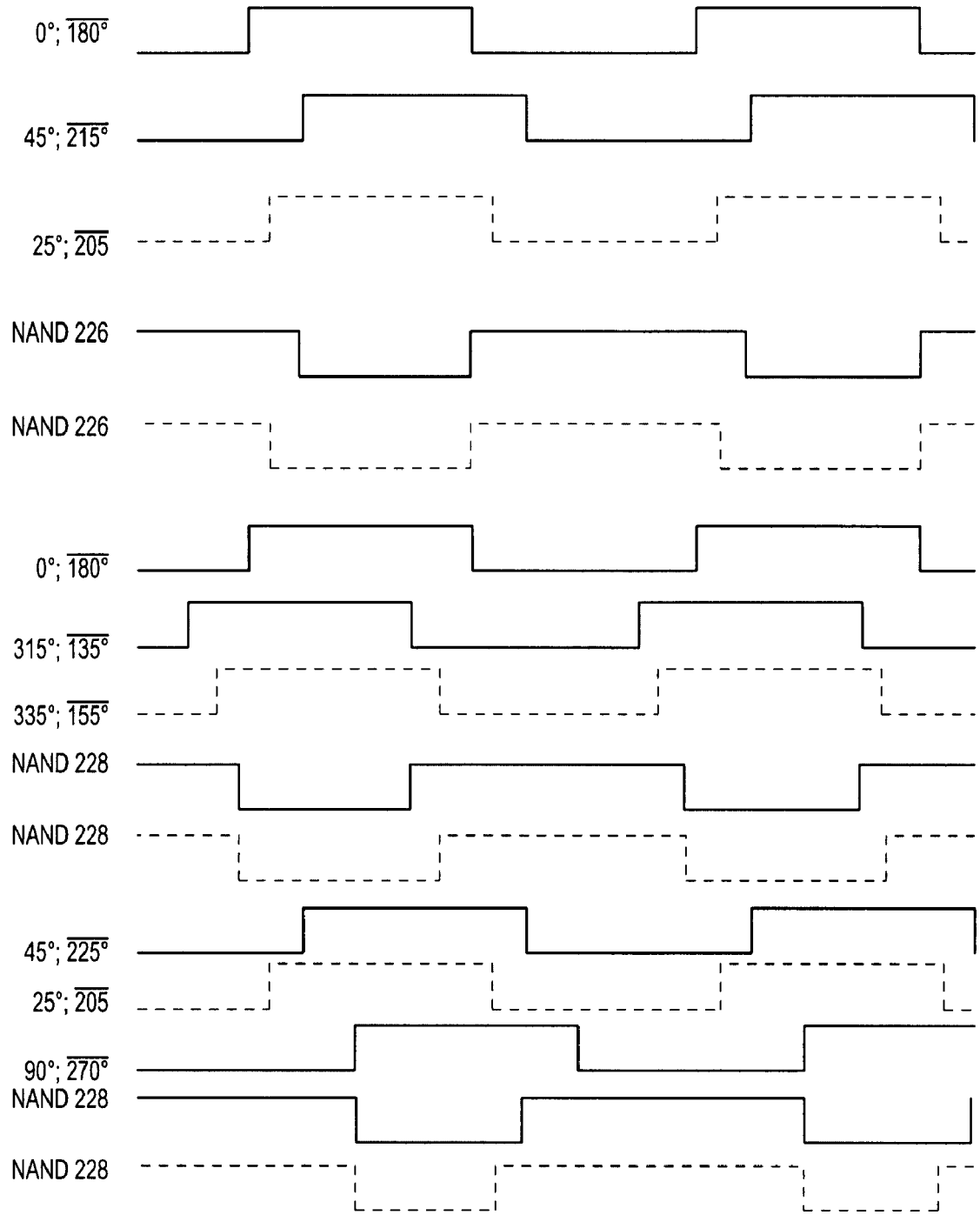
FIG. 6 is a timing diagram showing some of the signals that are present in the duty cycle and phase placement correction circuit of FIG. 5.

Each of the NAND gates 226, 228 has two pairs of complementary inputs. However, for NAND gates 226, 228 that do not have complementary inputs, the complementary phase can be omitted, and, for purposes of clarity in the following explanation, will be ignored. The phase pairs coupled to the complementary inputs for both NAND gates 226, 228 should be for phases that differ from each other by the same phase magnitude, such as 45°. For example, the NAND gate 226 can receive clock signals having phases of 0° and 45°, and the second NAND gate 226 can receive clock signals having phases of 315° and 0°, as shown in FIG. 6 in solid lines. However, for purposes of illustration, clock signals are shown in dotted lines in which the phase of the 45° clock signal is 20° too low (i.e., at 25°) and the phase of the 315° clock signal is 20° too high (i.e., at 335°) as shown in FIG. 6. Also shown in FIG. 6 is a subsequent comparison in which the NAND gate 228 receives the 45° and 90° clock signals.

With further reference to FIGS. 5 and 6, the outputs of the NAND gates 226, 228 for 45° and 315° clock signal phases are shown in solid lines, and the outputs of the NAND gates 226, 228 for the 25° and 335° clock signal phases are shown in dotted lines. As can be seen from FIG. 6, the duty cycle of the signal at the output of the NAND gate 226, if the 45° clock signal did not have any phase error (as shown in solid lines), would be greater than the duty cycle of the signal at the output of the NAND gate 228, if the 315° clock signal had a phase error of 20° (as shown in dotted lines). The output of the comparator 220 would then be a "1." The digital controller 230 would incrementally change the phase control signal applied to the DAC 206 for the 315° clock signal to decrease the delay provided by the differential delay line 202 until the output of the comparator 220 toggled from "1" to "0." The phase of the 315° clock signal would then be properly set to 315°.

As mentioned above, the clock signals are shown in FIG. 6 in dotted lines for a "worst case" situation in which the phase error of the 45° clock signal matches the phase error of the 315° clock signal. In this case, the duty cycle of the signal from the NAND gate 226 (as shown in dotted lines) is the same as the duty cycle of the signal from the NAND gate 228 (as also shown in dotted lines). Under these circumstances, the comparator 220 would quickly toggle from "1" to "0" or vice-versa, thus incorrectly indicating that the phases of the 45° and 315° clock signals were properly set. However, in the next comparison, the phase multiplexer 212 couples the 45° and 90° clock signals to the NAND gate 228. In this case, the duty cycle of the signal at the output of the NAND gate 228 would be greater than the duty cycle of the signal at the output of the NAND gate 228 as shown in dotted lines in FIG. 6. Under these circumstances, the comparator 220 would output a digital signal having a value of "0." The digital controller 230 would then incrementally increase the phase of the 45° clock signal. When the phase of the 45° clock signal reached 45° as shown in solid line in FIG. 6, the digital signal at the output of the comparator 220 would toggle to "1" thereby indicating that the duty cycle of the signal at the output of the NAND gate 228 was equal to the duty cycle of the signal at the output of the NAND gate 226. Therefore, the phase of the clock signals are corrected even in a worst-case situation in which the phase error of one clock signal compensated for the phase error of another clock signal.

After the phase difference between the 0° and 45° clock signals have been compared to the phase difference between the 0° and 315° clock signals as explained above, the phase difference between the 0° and 45° clock signals are compared to the phase difference between the 45° and 90° clock signals, as also explained above. Finally, the NAND gate 228 continues to receive the 45° and 90° clock signals while the multiplexer 210 couples the 90° and 135° clock signals to the inputs of the NAND gate 226. At this point, the phases of all of the clock signals or their complements have been set. Insofar as the phase correction process without separate comparisons of each clock signal in a complementary pair, i.e., the comparison for the 315° clock signal suffices for the 135° clock signal, the phase adjustment process can be accomplished for clock signals that are not generated in differential pairs.

When the phase correction process is completed, some changes to the duty cycle are likely to have occurred. Therefore, the duty cycle correction process is repeated and likewise the phase correction cycle is repeated again. The processes continue to repeat until both the duty cycle and phase placement have been fully corrected. The properly conditioned differential clock signals are then coupled through respective drivers 240 and a corrected clock signal tree 244 to appropriate circuitry (not shown) such as phase interpolators.

Although the duty cycle correction and phase placement correction processes have been shown and explained as being performed by the digital controller 230, it should be understood that it can be performed by other means, such as manually.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method of conditioning clock signals, the method comprising:
   generating a plurality of pairs of complementary clock signals, each clock signal having a phase and a duty cycle;
   generating first and second voltages having respective magnitudes corresponding to the duty cycles of first and second clock signals in one of the pairs of complementary clock signals;
   comparing the magnitude of the first voltage to the magnitude of the second voltage;
   if the magnitude of the first voltage is greater than the magnitude of the second voltage, decreasing the duty cycle of the first clock signal and increasing the duty cycle of the second clock signal until the magnitude of the first voltage is no longer greater than the magnitude of the second voltage; and
   if the magnitude of the second voltage is greater than the magnitude of the first voltage, increasing the duty cycle of the first clock signal and decreasing the duty cycle of the second clock signal until the magnitude of the second voltage is no longer greater than the magnitude of the first voltage.

2. The method of claim 1 wherein the act of generating first and second voltages having respective magnitudes corresponding to the duty cycles of first and second clock signals comprise low-pass filtering the first clock signal to generate the first voltage, and low-pass filtering the second clock signal to generate the second voltage.

3. The method of claim 1, further comprising adjusting the phase of each of the clock signals in the plurality of pairs of complementary clock signals.

4. The method of claim 3 wherein the act of adjusting the phase of each of the clock signals in the plurality of pairs of complementary clock signals comprises:
   comparing to each other a first set of clock signals that are assigned a predetermined phase difference to provide a first phase comparison signal indicative of the results of the comparison;
   comparing to each other a second set of clock signals that are assigned the predetermined phase difference to provide a second phase comparison signal indicative of the results of the comparison, at least one of the clock signals in the second set being different from the clock signals in the first set;
   comparing the first phase comparison signal to the second phase comparison signal;
   if the comparison of the first phase comparison signal to the second phase comparison signal has a first value, changing the phase of one of the clock signals in one of the first and second sets in a manner that changes the comparison of the clock signals in the first set or the comparison of the clock signals in the second set in a first direction; and
   if the comparison of the first phase comparison signal to the second phase comparison signal has a second value, changing the phase of one of the clock signals in one of the first and second sets in a manner that changes the comparison of the clock signals in the first set or the comparison of the clock signals in the second set in a second direction that is different from the first direction.

5. The method of claim 4 wherein the act of comparing the clock signals in the first set to each other and comparing the clock signals in the second set to each other comprise processing the clock signals in the first set with a first logic function, and processing the clock signals in the second set with a second logic function.

6. The method of claim 5 wherein the first logic function is the same as the second logic function.

7. The method of claim 4 wherein the act of comparing the clock signals in the first set to each other comprises generating as the first phase comparison signal a signal having a duty cycle corresponding to the phase relationship between the clock signals in the first set, and wherein the act of comparing the clock signals in the second set to each other comprises generating as the second phase comparison signal a signal having a duty cycle corresponding to the phase relationship between the clock signals in the second set.

8. The method of claim 7 wherein the act of comparing the first phase comparison signal to the second phase comparison signal comprises comparing the duty cycle of the first phase comparison signal to the duty cycle of the second phase comparison signal.

9. The method of claim 8 wherein the act of comparing the duty cycle of the first phase comparison signal to the duty cycle of the second phase comparison signal comprises:
   generating respective first and second phase comparison voltages having respective magnitudes corresponding to the duty cycles of first and second phase comparison signals; and
   comparing the magnitude of the first phage comparison voltage to the magnitude of the second phase comparison voltage.

10. The method of claim 9 wherein the act of generating respective first and second phase comparison voltages having respective magnitudes corresponding to the duty cycles of first and second phase comparison signals comprises low-pass filtering the first and second phase comparison signals.

11. The method of claim 4 wherein the act of comparing the first phase comparison signal to the second phase comparison signal comprises:
   low-pass filtering the first phase comparison signal to provide a first comparison signal;
   low-pass filtering the second phase comparison signal to provide a second comparison signal; and
   comparing the magnitude of the first comparison signal to the magnitude of the second comparison signal.

12. The method of claim 4 wherein the predetermined phase difference comprises 45 degrees.

13. The method of claim 3, further comprising, after adjusting the phase of each of the clock signals in the plurality of pairs of complementary clock signals, adjusting the duty cycles of each of the clock signals in the plurality of pairs of complementary clock signals by repeating the conditioning the clock signals according to the method of claim 1.

14. A method of adjusting the relative phases of each of a plurality clock signals, comprising:
   comparing to each other a first set of clock signals that are assigned a predetermined phase difference to provide a first phase comparison signal indicative of the results of the comparison;

comparing to each other a second set of clock signals that are assigned the predetermined phase difference to provide a second phase comparison signal indicative of the results of the comparison, at least one of the clock signals in the second set being different from the clock signals in the first set;

comparing the first phase comparison signal to the second phase comparison signal;

if the comparison of the first phase comparison signal to the second phase comparison signal has a first value, changing the phase of one of the clock signals in one of the first and second sets in a manner that changes the comparison of the clock signals in the first set or the comparison of the clock signals in the second set in a first direction; and if the comparison of the first phase comparison signal to the second phase comparison signal has a second value, changing the phase of one of the clock signals in one of the first and second sets in a manner that changes the comparison of the clock signals in the first set or the comparison of the clock signals in the second set in a second direction that is different from the first direction.

15. The method of claim 14 wherein the act of comparing the clock signals in the first set to each other and comparing the clock signals in the second set to each other comprise processing the clock signals in the first set with a first logic function, and processing the clock signals in the second set with a second logic function.

16. The method of claim 15 wherein the first logic function is the same as the second logic function.

17. The method of claim 14 wherein the act of comparing the clock signals in the first set to each other comprises generating as the first phase comparison signal a signal having a duty cycle corresponding to the phase relationship between the clock signals in the first set, and wherein the act of comparing the clock signals in the second set to each other comprises generating as the second phase comparison signal a signal having a duty cycle corresponding to the phase relationship between the clock signals in the second set.

18. The method of claim 17 wherein the act of comparing the first phase comparison signal to the second phase comparison signal comprises comparing the duty cycle of the first phase comparison signal to the duty cycle of the second phase comparison signal.

19. The method of claim 18 wherein the act of comparing the duty cycle of the first phase comparison signal to the duty cycle of the second phase comparison signal comprises:

generating respective first and second phase comparison voltages having respective magnitudes corresponding to the duty cycles of first and second phase comparison signals; and comparing the magnitude of the first phage comparison voltage to the magnitude of the second phase comparison voltage.

20. The method of claim 19 wherein the act of generating respective first and second phase comparison voltages having respective magnitudes corresponding to the duty cycles of first and second phase comparison signals comprises low-pass filtering the first and second phase comparison signals.

21. The method of claim 14 wherein the act of comparing the first phase comparison signal to the second phase comparison signal comprises:

low-pass filtering the first phase comparison signal to provide a first comparison signal;

low-pass filtering the second phase comparison signal to provide a second comparison signal; and comparing the magnitude of the first comparison signal to the magnitude of the second comparison signal.

22. The method of claim 14 wherein the predetermined phase difference comprises 45 degrees.

23. A method of conditioning a clock the method comprising:

generating a plurality of pairs of complementary clock signals, each clock signal having a phase and a duty cycle; and alternating correcting the duty cycle of the clock signals in each of the plurality of pairs of complementary clock signals and setting the phases of the clock signals in each of the plurality of pairs of complementary clock signals until the duty cycle of the clock signals have been corrected and the phases of the clock signals have been set, the duty cycle of the clock signals being corrected and the phases of the clock signals being corrected by:

selecting a first set of the clock signals that are assigned a predetermined phase difference;

selecting a second set of the clock signals that are assigned the predetermined phase difference, at least one of the clock signals in the second set being different from the clock signals in the first set;

generating a first phase comparison signal having a duty cycle corresponding to the phase relationship between the clock signals in the first set;

generating a second phase comparison signal having a duty cycle corresponding to the phase relationship between the clock signals in the second set;

generating first and second duty cycle voltages having respective magnitudes corresponding to the duty cycles of first and second clock signals in each of the pairs of complementary clock signals;

generating first and second phase comparison voltages having respective magnitudes corresponding to the duty cycles of first and second phase comparison signals;

comparing the magnitude of the first duty cycle voltage to the magnitude of the second duty cycle voltage;

if the magnitude of the first duty cycle voltage is greater than the magnitude of the second duty cycle voltage, decreasing the duty cycle of the first clock signal and increasing the duty cycle of the second clock signal until the magnitude of the first duty cycle voltage is no longer greater than the magnitude of the second duty cycle voltage;

if the magnitude of the second duty cycle voltage is greater than the magnitude of the first duty cycle voltage, increasing the duty cycle of the first clock signal and decreasing the duty cycle of the second clock signal until the magnitude of the second duty cycle voltage is no longer greater than the magnitude of the first duty cycle voltage;

comparing the magnitude of the first phase comparison voltage to the magnitude of the second phase comparison voltage;

if the magnitude of the first phase comparison voltage is greater than the magnitude of the second phase comparison voltage, changing the phase of one of the clock signals in one of the first and second sets in a manner that changes the phase relationship between the clock signals in the first set or the second set in a first direction until the magnitude of the first phase comparison voltage is no longer greater than the magnitude of the second phase comparison voltage; and if the magnitude of the second phase comparison voltage is greater than the magnitude of the first phase comparison voltage, changing the phase of one of the clock signals in one of the first and second sets in a manner that changes the phase relationship between the clock signals in the first set or the second set in a second direction that is opposite the first direction until the magnitude of the second phase comparison voltage is no longer greater than the magnitude of the first phase comparison voltage.

24. The method of claim 23 wherein the act of generating the first and second duty cycle voltages comprises low-pass filtering the first and second clock signals, respectively, and wherein the act of generating the first and second phase comparison voltages comprise low-pass filtering the first and second phase comparison signals, respectively.

25. The method of claim 23 wherein the predetermined phase difference comprises 45 degrees.

26. A system for conditioning clock signals in a plurality of complementary pairs of the clock signals, each clock signal having a phase and a duty cycle, the system comprising:
a plurality of duty cycle correctors each of which receives the clock signals of a respective one of the pairs of clock signals, the duty cycles of the clock signals output from the duty cycle correctors being controlled by respective duty cycle control signals;
a plurality of delay lines each of which receives the clock signals of a respective one of the pairs of clock signals, the phases of the clock signals output from the delay lines being controlled by respective phase control signals, each of the delay lines being coupled in series with a respective one of the duty cycle correctors;
a first processing circuit having a plurality of input terminals, the first processing circuit being operable to generate at an output terminal a first phase comparison signal having a duty cycle corresponding to a phase relationship between clock signals applied to the input terminals of the first processing circuit;
a second processing circuit having a plurality of input terminals, the second processing circuit being operable to generate at an output terminal a second phase comparison signal having a duty cycle corresponding to a phase relationship between clock signals applied to the input terminals of the second processing circuit;
a comparison circuit having a plurality of input terminals, the comparison circuit being operable to compare the duty cycle of clock signals applied to the input terminals of the comparison circuit and to generate a comparison signal corresponding thereto;
a controller coupled to receive the comparison signal from the comparison circuit, the controller being operable to apply to the duty cycle correctors the respective duty cycle control signals based on the comparison signal and to apply to the delay lines respective phase control signals based on the comparison signal; and
a switching circuit coupled to receive the clock signals from the series combinations of a respective duty cycle correctors and delay lines, and to receive the first and second phase comparison signals from the first and second processing circuits, respectively, the switching circuit being operable in a duty cycle correcting mode to sequentially couple the clock signals of each of the pairs of clock signals to the input terminals of the comparison circuit, the switching circuit being operable in a phase adjustment mode to couple the first and second phase comparison signals of the first and second processing circuits, respectively, to the input terminals of the comparison circuit, the switching circuit further being operable in the phase adjustment mode to sequentially couple to the input terminals of the first processing circuit a first set of clock signals that are assigned a predetermined phase difference while coupling to the input terminals of the second processing circuit a second set of clock signals that are assigned the predetermined phase difference, at least one of the clock signals in the second set being different from the clock signals in the first set.

27. The clock signal conditioning system of claim 26 wherein the first and second processing circuits comprise respective logic gates.

28. The clock signal conditioning system of claim 27 wherein the logic gates comprise respective NAND gates.

29. The clock signal conditioning system of claim 26 wherein the comparison circuit comprises:
a respective low-pass filter coupled to each of the input terminals of the comparison circuit, each of the low-pass filters being structured to output a respective output signal; and
a comparator having a plurality of inputs each of which is coupled to receive an output signal from a respective one of the low-pass filters, the comparator being operable to compare the magnitudes of the output signals from the low-pass filters.

30. The clock signal conditioning system of claim 29 wherein the comparator is operable to receive output signals from two low-pass filters and to generate a binary signal indicative of the polarity of the comparison between the magnitudes of the output signals from the low-pass filters.

31. The clock signal conditioning system of claim 26 wherein the switching circuit comprises at least one multiplexer.

32. The clock signal conditioning system of claim 31 wherein the switching circuit comprises:
a first multiplexer coupled to receive the clock signals of each of the pairs of clock signals and to couple the received the clock signals of a selected pair of the clock signals to respective output terminals;
a second multiplexer coupled to receive the clock signals of each of the pairs and to couple a selected two of the received the clock signals to the input terminals of the first processing circuit;
a third multiplexer coupled to receive the clock signals of each of the pairs and to couple a selected two of the received the clock signals to the input terminals of the second processing circuit; and
a fourth multiplexer having input terminals coupled to the output terminals of the first multiplexer and to the output terminals of the first and second processing circuits, respectively, the fourth multiplexer being operable in the duty cycle correcting mode to couple the output terminals of the first multiplexer to the input terminals of the comparison circuit, and being operable in the phase adjustment mode to couple the output terminals of the first and second processing circuits to the input terminals of the comparison circuit.

33. An integrated circuit load board, comprising:
a substrate;
a plurality of integrated circuit sockets mounted on the substrate;
a clock source generating a plurality of complementary pairs of the clock signals, each clock signal having a phase and a duty cycle;
a clock signal conditioning system coupled to receive the clock signals from the clock source, the clock signal conditioning system comprising:
a plurality of duty cycle correctors each of which receives the clock signals of a respective one of the pairs of clock signals, the duty cycles of the clock signals output from the duty cycle correctors being controlled by respective duty cycle control signals;

a plurality of delay lines each of which receives the clock signals of a respective one of the pairs of clock signals, the phases of the clock signals output from the delay lines being controlled by respective phase control signals, each of the delay lines being coupled in series with a respective one of the duty cycle correctors;

a first processing circuit having a plurality of input terminals, the first processing circuit being operable to generate at an output terminal a first phase comparison signal having a duty cycle corresponding to a phase relationship between clock signals applied to the input terminals of the first processing circuit;

a second processing circuit having a plurality of input terminals, the second processing circuit being operable to generate at an output terminal a second phase comparison signal having a duty cycle corresponding to a phase relationship between clock signals applied to the input terminals of the second processing circuit;

a comparison circuit having a plurality of input terminals, the comparison circuit being operable to compare the duty cycle of clock signals applied to the input terminals of the comparison circuit and to generate a comparison signal corresponding thereto;

a controller coupled to receive the comparison signal from the comparison circuit, the controller being operable to apply to the duty cycle correctors the respective duty cycle control signals based on the comparison signal and to apply to the delay lines respective phase control signals based on the comparison signal; and a switching circuit coupled to receive the clock signals from the series combinations of a respective duty cycle correctors and delay lines, and to receive the first and second phase comparison signals from the first and second processing circuits, respectively, the switching circuit being operable in a duty cycle correcting mode to sequentially couple the clock signals of each of the pairs of clock signals to the input terminals of the comparison circuit, the switching circuit being operable in a phase adjustment mode to couple the first and second phase comparison signals of the first and second processing circuits, respectively, to the input terminals of the comparison circuit, the switching circuit further being operable in the phase adjustment mode to sequentially couple to the input terminals of the first processing circuit a first set of clock signals that are assigned a predetermined phase difference while coupling to the input terminals of the second processing circuit a second set of clock signals that are assigned the predetermined phase difference, at least one of the clock signals in the second set being different from the clock signals in the first set; and an integrated test circuit mounted on the substrate and coupled to the integrated circuit sockets and to the clock signal conditioning system, the integrated test circuit being operable to apply test signals to the integrated circuit sockets and to receive response signals from the integrated circuit sockets, the integrated test circuit having an output port from which test results data derived from the response signals are output, the integrated test circuit being operable to alter the relative timing at which the test signals are applied to the integrated circuit sockets based on a plurality of clock signals received from the clock signal conditioning system.

34. The integrated circuit load board of claim 33 wherein the first and second processing circuits comprise respective logic gates.

35. The integrated circuit load board of claim 34 wherein the logic gates comprise respective NAND gates.

36. The integrated circuit load board of claim 33 wherein the comparison circuit comprises:

a respective low-pass filter coupled to each of the input terminals of the comparison circuit, each of the low-pass filters being structured to output a respective output signal; and a comparator having a plurality of inputs each of which is coupled to receive an output signal from a respective one of the low-pass filters, the comparator being operable to compare the magnitudes of the output signals from the low-pass filters.

37. The integrated circuit load board of claim 36 wherein the comparator is operable to receive output signals from two low-pass filters and to generate a binary signal indicative of the polarity of the comparison between the magnitudes of the output signals from the low-pass filters.

38. The integrated circuit load board of claim 33 wherein the switching circuit comprises at least one multiplexer.

39. The integrated circuit load board of claim 38 wherein the switching circuit comprises:

a first multiplexer coupled to receive the clock signals of each of the pairs of clock signals and to couple the received the clock signals of a selected pair of the clock signals to respective output terminals;

a second multiplexer coupled to receive the clock signals of each of the pairs and to couple a selected two of the received the clock signals to the input terminals of the first processing circuit;

a third multiplexer coupled to receive the clock signals of each of the pairs and to couple a selected two of the received the clock signals to the input terminals of the second processing circuit; and a fourth multiplexer having input terminals coupled to the output terminals of the first multiplexer and to the output terminals of the first and second processing circuits, respectively, the fourth multiplexer being operable in the duty cycle correcting mode to couple the output terminals of the first multiplexer to the input terminals of the comparison circuit, and being operable in the phase adjustment mode to couple the output terminals of the first and second processing circuits to the input terminals of the comparison circuit.

* * * * *